US012733237B2

(12) United States Patent
Siemieniec et al.

(10) Patent No.: US 12,733,237 B2
(45) Date of Patent: Sep. 8, 2026

(54) SEMICONDUCTOR DEVICE AND METHOD

(71) Applicant: Infineon Technologies Austria AG, Villach (AT)

(72) Inventors: Thomas Ralf Siemieniec, Villach (AT); Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 326 days.

(21) Appl. No.: 18/466,432

(22) Filed: Sep. 13, 2023

(65) Prior Publication Data

US 2024/0105784 A1 Mar. 28, 2024

(30) Foreign Application Priority Data

Sep. 28, 2022 (EP) .................................... 22198238

(51) Int. Cl.

*H10D 64/00* (2025.01)
*H10D 12/00* (2025.01)
*H10D 12/01* (2025.01)
*H10D 30/01* (2025.01)
*H10D 30/66* (2025.01)

(52) U.S. Cl.

CPC ......... *H10D 64/117* (2025.01); *H10D 12/038* (2025.01); *H10D 12/481* (2025.01); *H10D 30/0297* (2025.01); *H10D 30/668* (2025.01)

(58) Field of Classification Search

CPC .. H10D 64/117; H10D 12/481; H10D 30/668; H10D 12/038; H10D 30/0297
USPC .......................................................... 257/330
See application file for complete search history.

(56) References Cited

U.S. PATENT DOCUMENTS 10,304,933 B1 5/2019 Woo et al.
2017/0263767 A1 9/2017 Nishiwaki
2017/0330943 A1 11/2017 Haase et al.
2020/0083335 A1* 3/2020 Leomant .............. H10D 64/117
2022/0231136 A1* 7/2022 Leomant ........... H01L 21/02236
2023/0163210 A1* 5/2023 Ma ....................... H10D 64/117
257/330

FOREIGN PATENT DOCUMENTS

CN 106298939 A 1/2017
WO 2012006261 A2 1/2012

* cited by examiner

*Primary Examiner* — Igwe U Anya
(74) *Attorney, Agent, or Firm* — Murphy, Bilak & Homiller, PLLC

(57) ABSTRACT

A semiconductor device includes: a semiconductor substrate having a first major surface; a trench extending from the first major surface into the semiconductor substrate and having a base and a side wall extending from the base to the first major surface; a field plate arranged in the trench and having a height f; and a dielectric structure arranged between the semiconductor body and the field plate. The dielectric structure includes a first portion having a first dielectric constant and a second portion having a second dielectric constant that is higher than the first dielectric constant, the first portion being arranged in a lower portion of the trench and the second portion being arranged in an upper portion of the trench. The second portion of the dielectric structure overlaps the height of the field plate by a distance vi, where $f*0.1 \leq vi \leq f*0.8$.

18 Claims, 8 Drawing Sheets

50a
50b
13
15
50a
51'
12
11
14

50a
15
50a
50b
12
50
13
11
14

13
50a
15
50a
12
11
14

15
50a
12
13
14
11

12
53
16
54
21
15
25
11
14

51
16
21
15
27
26
11
14
13
25

53
51
52
12
21
15
13
11
14

50b
50a
12
52
51
50
13
15
11
14

12
13
50a
11
15
60
14

12
50a
58
15
60
13
11
14

50a
12
15
13
11
57
14

12
15
13
11
50a
14

12
21
15
13
50b
25
50a
11
16
14
23

53
16
53

59
51

50b 11
13
16
19
20
22
55
$x_2$
x
z
12
14
15
21
25
29
54
56
53

SEMICONDUCTOR DEVICE AND METHOD

BACKGROUND

Transistors used in power electronic applications are typically fabricated with silicon (Si) semiconductor materials. Common transistor devices for power applications include Si CoolMOS®, Si Power MOSFETs, and Si Insulated Gate Bipolar Transistors (IGBTs).

U.S. Pat. No. 10,304,933 B1 discloses a trench-based MOSFET device with a shield electrode, also commonly referred to as a field plate, at the base of the trench under a gate electrode that is arranged towards the top of the trench. The shield electrode is electrically insulated from the gate electrode and the side wall of the trench by a shield dielectric that includes solid dielectric portions and a cavity disposed between the shield electrode and the sidewall of the trench. The cavity may be gas-filled, for example air-filled, and have a dielectric constant which is less than the dielectric constant of solid material used in the shield dielectric. In the device of U.S. Pat. No. 10,304,933 B1, overall, the effective dielectric constant of the shield dielectric is reduced with the aim of reducing the gate drain capacitance.

Further improvements to trench-based transistor devices and methods for fabricating trench-based transistor devices are desirable.

SUMMARY

According to an exemplary embodiment, a semiconductor device is provided which comprises a semiconductor substrate having a first major surface, a trench extending from the first major surface into the semiconductor substrate. The trench has a base and a sidewall which extends from the base to the first major surface. A field plate is arranged in the trench and has a height f. The field plate is electrically insulated from the semiconductor substrate by a dielectric structure arranged in the trench. The dielectric structure comprises a first portion comprising a first dielectric constant and a second portion comprising a second dielectric constant that is higher than the first dielectric constant. The first portion of the dielectric structure is arranged in a lower portion of the trench and the second portion of the dielectric structure is arranged in an upper portion of the trench.

In some embodiments, the second portion of the dielectric structure has a height or thickness x and overlaps the height of the field plate by a distance $v_1$, wherein $f*0.1 \leq v_1 \leq f*0.8$ or $f*0.3 \leq v_1 \leq f*0.6$.

In some embodiments, the lower first portion of the dielectric structure comprises an oxide, e.g. silicon dioxide, and the upper second portion of the dielectric structure comprises a so-called HighK dielectric. A HighK dielectric material has a higher dielectric constant (κ, kappa) compared to silicon dioxide. Examples of a HighK dielectric material include hafnium silicate, zirconium silicate, hafnium dioxide and zirconium dioxide.

The higher dielectric constant of the second portion of the dielectric structure that is located towards the upper part of the field plate and in the upper part of the trench allows the semiconductor substrate in the region of the semiconductor substrate laterally adjoining the second portion of the dielectric structure to have a higher doping level. This enables an improvement in the parameter Ron (on resistance)×A compared to structures in which the dielectric structure is formed by a single material having a single dielectric constant. At the same time, an unacceptably high increase in the breakdown voltage may be avoided.

The field plate may be formed of conductive material, for example polysilicon, and is electrically insulated from the semiconductor substrate by the dielectric structure. The dielectric material of the upper second portion of the dielectric structure may be solid and the second portion of the dielectric structure may have a thickness x such that it overlaps the field plate by a distance $v_1$ of at least 10% of the height f of the field plate. The overlapping distance v1 may extend substantially perpendicularly to the first major surface when the field plate and the second portion of the dielectric structure extend into the trench substantially perpendicularly to the first major surface. At least the portion of the second portion of the dielectric structure that overlaps the field plate is positioned within the trench and below the first major surface. At least 20% of the height f of the field plate is not vertically overlapped by the second portion of the dielectric structure. The height of the field plate that is not vertically overlapped by the upper second portion of the dielectric structure may be vertically overlapped by the lower first portion of the dielectric structure.

In some embodiments, the dielectric structure further comprises one or more intermediate portions of the dielectric structure that are arranged vertically between the first and second portion of the dielectric structure and that comprise a material with a dielectric constant that is intermediate that of the first and second portion of the dielectric structure so that the dielectric constant increases in the direction from the base of the trench to the first major surface of the semiconductor substrate.

In some embodiments, the first, second and any intermediate portions of the dielectric structure are formed of a solid dielectric material.

In some embodiments, the first portion of the dielectric structure comprises a cavity and the second portion of the dielectric structure seals the cavity so that an enclosed and sealed cavity is formed between a side wall of the field plate and the side wall of the trench and within the trench. The cavity is empty, i.e. free of solid material and may be vacuum-filled or gas-filled. The cavity may also be called a void.

In some embodiments, the second portion of the dielectric structure is formed of dielectric material that is positioned in the upper portion of the trench and that extends between the field plate and the side wall of the trench. The second portion of the dielectric structure can be considered to form a cap or plug which seals and encloses the cavity within the trench. The second portion of the dielectric structure can be considered to have the form of a plug or stopper that is positioned in the upper portion of the trench and that extends between the field plate and the side wall of the trench. The second portion of the dielectric structure may be formed of dielectric material in the solid state.

The first portion and the second portion of the dielectric structure may each have a ring-shape, whereby the outer contour of the ring corresponds to the inner contour of the trench, e.g. rectangular in plan view for a rectangular strip-like trench, and the inner contour of the ring corresponds to the outer contour of the field plate, e.g. rectangular in plan view for a rectangular strip-like field plate and rectangular strip-like trench.

The second portion of the dielectric structure may be positioned entirely within the upper portion of the trench or may have a T-shape in cross-section and extend over an edge region of the first major surface and upper surface of the field plate. One or more further dielectric layers may be arranged on the first major surface of the semiconductor substrate that further extend over the upper surface of the second portion of the dielectric structure and the upper surface of the field plate. These one or more further dielectric layers may be part of a metallization structure.

In some embodiments, the second portion of the dielectric structure is formed by a portion of a dielectric layer that extends in a vertical direction into the upper portion of the trench. This dielectric layer also extends laterally over the first major surface of the semiconductor substrate and the upper surface of the field plate. The portion of the dielectric layer located within the trench extends between the field plate and the side wall of the trench. The dielectric layer may be part of a metallization structure and the second portion of the dielectric structure may be an integral part of this dielectric layer. The portion of the dielectric layer forming the second portion of the dielectric structure in the trench have the form of a cap or plug that is positioned in the upper portion of the trench and that extends between the field plate and the side wall of the trench. The portion of the dielectric layer forming the second portion of the dielectric structure in the trench may have a ring-shape, whereby the outer contour of the ring corresponds to the inner contour of the trench, e.g. rectangular in plan view for a rectangular strip-like trench, and the inner contour of the ring corresponds to the outer contour of the field plate, e.g. rectangular in plan view for a rectangular strip-like field plate and rectangular strip-like trench.

In embodiments in which the first portion of the dielectric structure in the lower portion of the trench is a cavity, the contact between the second portion of the dielectric structure and the upper portion of the field plate and the side wall of the trench forms a seal, which may have the form of a cap or plug, that seals and encloses the cavity and assists in reliably sealing the cavity within the trench. This arrangement also assists in ensuring the position of the field plate within the trench. The second portion of the dielectric structure also may act to mechanically stabilised the solid material of the field plate within the trench since it vertically overlaps the upper most portion of the field plate by the distance x, whereby x refers to the maximum overlapping distance. Compared with an embodiment in which the trench further includes a gate electrode arranged towards the top of the trench, the field plate may have a greater height and is also not secured in position by means of a dielectric layer positioned intermediate the depth of the trench. The depth of the trench is the distance between the base of the trench and the first major surface of the semiconductor substrate.

In some embodiments, the enclosed cavity laterally and continuously surrounds the field plate within the trench. The cavity has an inner substantially vertical surface formed by the field plate and an outer substantially vertical surface formed by the side wall of the trench. The cavity has an upper surface formed by the lower surface of the second portion of the dielectric structure and a lower surface formed by the base of the trench.

In some embodiments, the dielectric material of the second portion of the dielectric structure is selected so as to have a higher dielectric constant than the dielectric constant of the cavity. The cavity may be filled with one or more gases, for example, air, or by the atmosphere present during the formation of the second portion of the dielectric structure. For example, the cavity may be filled with a vacuum or with a vacuum including various processing gases.

A semiconductor device is provided in which the dielectric constant of the dielectric structure, which electrically insulates the field plate from the semiconductor substrate, varies along the height of the field plate and, therefore, along the depth of the trench. The dielectric constant increases in a direction from the base of the field plate to the first major surface of the substrate.

In some embodiments, the dielectric structure comprises an enclosed and sealed cavity comprising a vacuum or gas located towards the lower region of the trench and a solid dielectric material located in the upper region of the trench. The cavity has a lower dielectric constant than the dielectric constant of the solid dielectric material forming the second portion of the dielectric structure.

The second portion of the dielectric structure that forms a cap for the cavity may be formed of a single material, such as silicon oxide, or may be formed of a so-called high-k dielectric material. In some embodiments, the second portion of the dielectric structure may be formed of two or more sublayers and include a lower sublayer and an upper sublayer on the lower sublayer. The lower sublayer forms the upper surface of the cavity. The lower sublayer has a dielectric constant which is higher than that of the cavity but which is lower than that of the upper sublayer. For example, the cavity may include a vacuum, the lower sublayer of the second portion of the dielectric structure may be formed of silicon oxide, and the upper sublayer may be formed of a high-k dielectric material.

The solid dielectric material of the second portion of the dielectric structure that is located towards the upper part of the field plate allows the semiconductor substrate in the region adjoining the first major surface to have a higher doping level whilst still enabling the pitch of the trenches to be reduced, since the cavity in the lower part of the trench enables the thickness of the dielectric layer in a lateral direction to be reduced and consequently, the pitch between trenches to be reduced. This enables an improvement in the parameter Ron (on resistance)×A (area) over structures in which the dielectric structure is formed by a single material having a single dielectric constant, whether this dielectric constant be that of the solid dielectric material of the second portion of the dielectric structure or that of the vacuum or gas within the cavity.

The semiconductor substrate may comprise an epitaxial deposited layer that is formed on a base substrate, for example an epitaxial silicon layer formed on a silicon wafer.

In some embodiments, the epitaxial layer comprises a drift region of the first conductivity a first conductivity type, a body region of a second conductivity type that opposes the first conductivity type and a source region of the first conductivity type. The body region is arranged on and forms a pn junction with the drift region. The source region is arranged on and/or in the body region. This structure forms a transistor device, such as a MOSFET. The transistor device is a vertical transistor device with a drift region that extends substantially perpendicularly to the first major surface.

The dielectric structure has a higher dielectric constant towards the top of the trench compared to the bottom of the trench. This arrangement may be used to allow an increase in the doping concentration in the drift zone in regions of the epitaxial layer adjacent to the second portion of the dielectric structure Thus, the higher dielectric constant of the second portion of the dielectric structure provides suitable electrical insulation over the increased conductivity of the drift zone due to the increased doping concentration of the drift zone in regions of the epitaxial layer located laterally adjacent to the second portion of the dielectric structure. This enables the parameter Ron×A to be reduced. Use is also made of the observation that the electric field is higher at the base of the trench than towards the opening of the trench at the first major surface. Consequently, the dielectric constant of the dielectric structure is selected to be lower towards the base in order to prove the electrical insulation towards the base of the trench. In other words, the dielectric constant of the first portion of the dielectric structure within the trench may be lower than the dielectric constant of the second portion of the dielectric structure within the trench.

In some embodiments, the field plate extends to or near to the first major surface of the semiconductor substrate.

The side wall of the trench may extend substantially perpendicularly to the first major surface or may be slightly inclined to the first major surface such that the trench is slightly tapered with a smaller area at its base than at the opening at the first major surface.

The trench in which the field plate is arranged may have an elongate stripe-like form having a length which extends parallel to the first major surface, its length being greater than its width and greater than its depth from the first major surface. In these embodiments, the side wall of the trench has a plurality of side wall sections which are arranged substantially perpendicularly to one other to from a stripe-like rectangular trench. Typically, a plurality of trenches is provided which extend substantially parallel to one another so that a stripe-like mesa of the semiconductor material of the semiconductor substrate is formed between adjacent ones of the trenches.

In other embodiments, the trench has a columnar or needle type shape. A columnar or needle-shaped trench has a small or narrow circumference or width in proportion to its height/depth in the substrate—A columnar or needle trench may have an octagonal, circular, square, hexagonal and shape in plan view. A columnar trench may have a single side wall, for example if the trench is circular in plan view, or may have a plurality of side walls sections arranged at an angle to one another, for example if the columnar trench has a square or hexagonal shape in plan view. Typically, a plurality of columnar trenches is provided. The columnar trenches consequently the field plate positioned in the trench may be arranged in a regular square grid array of rows and columns, or an offset rows or a hexagonal array, for example.

The semiconductor substrate may be formed of silicon and may be formed of monocrystalline silicon or an epitaxially deposited silicon layer, which is often referred to as an epi layer.

In some embodiments, the field plate has an upper surface which is substantially coplanar with the first major surface of the substrate. In some embodiments, the thickness x of the second portion of the dielectric structure, the height f of the field plate and the distance $v_1$ of the overlap between the second portion of the dielectric structure and the field plate are measured from the first major surface and perpendicularly to the first major surface. In embodiments in which the second portion of the dielectric structure and the field plate each have an upper surface that is substantially coplanar with the first major surface of the semiconductor substrate, the thickness of the second portion of the dielectric structure and the vertical overlap between the second portion of the dielectric structure and the field plate is the same, i.e. $x=v_1$. In some embodiments, the upper surface of the second portion of the dielectric structure is arranged above the first major surface of the substrate and the upper surface of the field plate is coplanar with the first major surface or positioned below the first major surface within the trench. In these embodiments, the thickness x of the second portion of the dielectric structure is greater than the vertical overlap $v_1$ between the second portion of the dielectric structure and the field plate, i.e. $x>v_1$.

The field plate is formed of a conductive material and in some embodiments of the semiconductor device the conductive property is used more generally. For example, in some embodiments, the semiconductor device may be a capacitor.

In other embodiments, the semiconductor device is a transistor device, for example a MOSFET device and the conductive field plate is used as a charge compensation structure. The field plate may be coupled to source potential or ground potential.

In some embodiments, the semiconductor substrate comprises a drift region of the first conductivity a first conductivity type, a body region of a second conductivity type that opposes the first conductivity type and a source region of the first conductivity type. The body region is arranged on and forms a pn junction with the drift region. The source region is arranged on and/or in the body region. This structure forms a transistor device, such as a MOSFET. The transistor device is a vertical transistor device with a drift region that extends substantially perpendicularly to the first major surface.

The pn junction formed between the drift region and the body region is located at a depth d from the first major surface. In some embodiments, the second portion of the dielectric structure is formed of the solid dielectric material and having the thickness x extends beyond the pn junction and overlaps the drift region by a distance $v_2$, wherein $d*0.1 \le v_2 \le d*0.8$ or $d*0.3 \le v_2 \le d*0.6$. In other embodiments, the second portion of the dielectric structure extends beyond the pn junction and overlaps the drift region by a distance $v_2$, wherein $f*0.1 \le v_2 \le f*0.8$ or $f*0.3 \le v_2 \le f*0.6$ In embodiments in which the distance x is measured from the first major surface, the lower surface of the second portion of the dielectric structure is positioned at a greater distance from the first major surface compared to the pn junction. The second portion of the dielectric structure extends into the trench beyond the pn junction by a distance $v_2$.

In some embodiments of a transistor device, the trench does not include a gate electrode so that the field plate extends to or near to the first major surface of the semiconductor substrate. The gate electrode may be arranged in the gate trench which is arranged in a mesa laterally adjacent the trench in which the field plate is positioned. The gate trench also extends from the first major surface into the semiconductor substrate. A plurality of trenches may be provided such that a mesa is formed between adjacent ones of the trenches with a gate trench positioned in each mesa.

In some embodiments, the dielectric structure within the trench further comprises a pillar of solid-state dielectric material which is positioned between the base of the trench and a lower surface of the field plate. The lower surface of the field plate is spaced apart from the base of the trench by the pillar of solid dielectric material which has a height a.

The first portion of the dielectric structure has a base or lower surface which vertically overlaps with the pillar of dielectric material by a distance b. In some embodiments, the lower surface of the first portion of the dielectric structure is in direct contact with the peripheral regions of the base of the trench such that the first portion of the dielectric structure extends from the base of the trench to the lower surface of the upper second portion of the dielectric structure. In other embodiments, the base of the trench is entirely covered by an additional dielectric material. The first portion of the dielectric structure has a height which is such that it vertically overlaps with at least an upper portion of the pillar of dielectric material by a distance b. In some embodiments, the distance b is $b \geq a*0.6$ or $b \geq a*0.8$. The lower surface of the first portion of the dielectric structure may be spaced apart from the base of the trench by a distance a−b and $0 \leq (a-b) \leq a*0.4$.

In embodiments in which the first portion of the dielectric structure is formed by a cavity, the cavity has a base which vertically overlaps with the pillar of dielectric material by a distance b. In some embodiments, the base of the cavity may be formed by the peripheral regions of the base of the trench such that the cavity extends from the base of the trench to the lower surface of the second portion of the dielectric structure. In other embodiments, the base of the trench is entirely covered by dielectric material such that the cavity has a base formed by dielectric material. The cavity has a height which is such that it vertically overlaps with at least an upper portion of the pillar of dielectric material by a distance b. In some embodiments, the distance b is $b \geq a*0.6$ or $b \geq a*0.8$. The base of the cavity is spaced apart from the base of the trench by a distance a−b and $0 \leq (a-b) \leq a*0.4$.

In some embodiments, the pillar of dielectric material comprises two or more sublayers which may have the same composition, for example silicon oxide, or differing compositions. Two sublayers formed of the same composition, for example silicon oxide, may be formed using different methods, for example thermal oxidation and high density plasma deposition.

In embodiments in which the first portion of the dielectric structure is a cavity, at least the side wall of the field plate and the sidewalls and base of the trench may be covered with a dielectric layer which forms a liner layer. In this embodiment, the cavity comprises a base and sidewalls formed by dielectric layer and is sealed at the top by the second portion of the dielectric structure formed by a solid dielectric material.

In some embodiments, the second portion of the dielectric structure that provides a cap for the cavity is formed of silicon dioxide and the dielectric liner layer, if used, is also formed of silicon oxide. In some embodiments, the cap, pillar and the dielectric liner layer are formed of silicon oxide so that the cavity is bounded on all sides by silicon oxide. This may assist in forming a good seal between the cap and the dielectric liner layer and also in providing a stable atmosphere or vacuum, within the cavity.

Exemplary embodiments also provide methods for fabricating a cavity in a trench which may be used to form the semiconductor device of any one of the embodiments described herein. The methods may be used to form a capacitor or a transistor device.

In an embodiment, the method comprises forming a trench in a first major surface of the semiconductor substrate, the trench having a base and a sidewall extending from the base to the first major surface. The method further comprises forming a first insulating layer on the base of the trench and on the sidewall of the trench, inserting conductive material into the trench and filling the trench. The first insulating layer is selectively removed from the sidewall and peripheral regions of the base of the trench to form a recess. A second insulating layer is formed in the trench that caps or seals the recess so as to form an enclosed cavity in the trench.

The cap is at least partly and in some embodiments is entirely positioned within the trench. In some embodiments, the cap has a thickness x and overlaps the height f of the conductive material. The recess is, however, not entirely filled by the second insulating layer such that the cavity is formed between the cap and base of the trench. The cavity may be filled with a vacuum or a gas. The cap may be positioned at least partially within the trench such that the cap overlaps the conductive material by a distance v1, wherein $f*0.1 \leq v_1 \leq f*0.8$ or $f*0.3 \leq v_1 \leq f*0.6$.

The dielectric material of the cap is solid and the cap has a thickness x such that it overlaps the field plate by a distance $v_1$ of at least 10% of the height f of the field plate and at least 20% of the height f of the field plate is not vertically overlapped by the cap so that a cavity is formed between the side wall of the field plate and the side wall of the trench within the trench. The overlapping distance v1 may extend substantially perpendicularly to the first major surface when the field plate and the cap extend into the trench substantially perpendicularly to the first major surface. At least the portion of the second portion of the dielectric structure, that overlaps the field plate, is positioned within the trench and below the first major surface. The dielectric material forming the cap may have a dielectric constant that is greater than the dielectric constant of the cavity and/or other material(s) used in the dielectric structure that is located within the trench under the cap.

After its formation, the first insulating layer bounds a central recess formed in the trench which has dimensions suitable for forming a field plate from the conducive material inserted into this recess. The first insulating layer may be formed by deposition or oxidation and may comprise multiple sublayers.

After the conductive material is inserted that fills the centrally positioned recess, the first insulating layer is subsequently selectively removed from the trench to form a recess at the periphery of the trench, whereby the conductive material and the material of the semiconductor substrate remain largely unetched. The first insulating layer may be subsequently selectively removed from the trench to form a recess at the periphery of the trench by wet etching, The selectivity of the material of the first insulating layer, e.g. silicon oxide, over the conductive material, e.g. polysilicon, and/or the material of the semiconductor substrate, e.g. silicon, may be around 100 to 1.

In some embodiments, the first insulating layer is selectively removed from the sidewall and peripheral regions of the base of the trench entirely so as to form a recess having a base and a sidewall formed by the material of the semiconductor substrate, e.g. silicon. An arrangement in which the conductive material is arranged on a pillar formed of the first insulating layer and spaced apart from the side wall of the trench by the recess is formed. In other words, the first insulating layer is not removed from regions of the trench positioned between the lower surface of the conductive material and the base of the trench. The conductive material may also have a pillar form and forms the field plate in embodiments in which the semiconductor device is a transistor device.

The shape of the conductive material in the trench and the field plate is determined by the shape of the trench. For example, for an elongate stripe-shaped trench, the field plate also has an elongate strip-like form. For a columnar trench, the field plate has a columnar form.

The first insulating layer may be formed on the base and the sidewall of the trench using various methods.

In an embodiment, the first insulating layer is formed by first forming a first insulating sublayer on the sidewall and base of the trench such that it bounds a centrally positioned recess in the trench. The first insulating sublayer is then at least partly removed from at least the sidewall of the trench. In some embodiments, the first insulating layer is entirely removed from the side wall. The first insulating sublayer remains on the base of the trench. The first insulating layer may be formed using different techniques which may result in different arrangements of the first insulating layer. For example, within a high density plasma (HDP) deposition the thickness on a planar surface, such as the base of the trench, is larger than the thickness on sidewalls, such as the trench sidewall. After an HDP deposition and an oxide wet etch, the oxide on the sidewalls may be removed. whereas the oxide on the base of the trench will partially remain.

A second insulating sublayer is then formed on the sidewall and on the first insulating sublayer arranged on the base of the trench. This forms an arrangement in which the total thickness of the insulating material on the base of the trench is greater than the thickness of the insulating material on the side wall of the trench. The remaining unfilled portion of the trench that is bounded by the second insulating sublayer forms the centrally positioned recess that defines the dimensions of the field plate and its position within the trench.

In an alternative embodiment, the first insulating layer is formed by forming the first insulating sublayer on the sidewall and the base of the trench such that bounds a centrally positioned recess in the trench. The trench, i.e. the remaining centrally positioned recess, is then filled with sacrificial material. The sacrificial material is then selectively removed from the upper portion of the trench to form a recess in the centre of the trench. A lowermost portion of the sacrificial material remains and forms a plug of sacrificial material that is arranged at the base of the recess and that is partially positioned within the first insulating sublayer. The centrally positioned recess is laterally surrounded by the first insulating sublayer. The method continues by at least partly removing the first insulating sublayer from the sidewall of the trench. In some embodiments, the first insulating layer is entirely removed from the side wall. Some of the first insulating sublayer remains on the base of the trench and the plug of the sacrificial material protrudes above the first insulating sublayer remaining on the base of the trench. The plug is then removed. This may result in the formation of an indentation in the first insulating sublayer which remains on the base of the trench. A second insulating sublayer is then formed on the sidewalls of the trench and on the first insulating sublayer which remains on the base of the trench. The second insulating sublayer may be conformally deposited such that an indentation is formed in the upper surface of the second insulating sublayer.

The sacrificial material may be removed by wet etching and/or ashing. The selectivity of the sacrificial material over the first insulating sublayer may be around 100 to 1.

The first insulating sublayer may be formed by high-density plasma deposition and the second insulating sublayer may be formed by atomic layer deposition. The first insulating sublayer may be removed from the sidewalls by wet etching.

In some embodiments, the first insulating layer is removed by wet etching or plasma etching or a combination may be used, for example wet etching followed by plasma etching. The second insulating layer which is used to cap the recess and form the cavity may be deposited by atomic layer deposition, or chemical vapour deposition or TEOS (Tetra Ethyl Ortho Silicate) deposition.

The methods of both embodiments result in a first insulating layer having a greater thickness at the base of the trench than on the sidewall of the trench.

In some embodiments, after selectively removing the first insulating layer from the sidewall and peripheral regions of the base of the trench either partially or entirely to form a recess, the method continues by forming a third insulating layer over the surface of the conductive material, the sidewalls of the trench and the peripheral regions of the base of the trench. The third insulating layer is a thin insulating layer such that the recess is still present between the sidewall of the conductive material and the sidewall and base of the trench which are lined with the third insulating layer. In this embodiment, the second insulating layer, that is formed in the trench and caps the recess to form the enclosed cavity in the trench, extends between the third insulating layer arranged on side wall of the conductive material and the side wall of the trench. The cavity is bounded by the third insulating layer positioned on sidewall and base of the trench and on the sidewall of the conductive material and by the cap formed by the second insulating layer arranged in the upper portion of the trench.

In some embodiments, while forming the second insulating layer so as to cap the recess and form the enclosed cavity of the trench, some of the material of the second insulating layer is formed on the peripheral regions of the base of the trench. In this embodiment, the cavity is bounded at the base and at the top by two separate regions of the second insulating layer. The sidewall of the cavity may be formed by the sidewall of the conductive material and the sidewall of the trench or may be formed by the third insulating layer if this is used.

In some embodiments, the first insulating layer is formed not only in the trench but is also formed over the first major surface of the substrate. The conductive material may also be further formed over the first insulating layer that is located on the first major surface of the substrate as well as on the first insulating layer within the trench. Subsequently, a planarization process is carried out.

The planarization process may be carried out using various methods. In one embodiment, the planarization process comprises selectively plasma etching the conductive material or a combination of chemical mechanical polishing to remove the conductive material followed by plasma etching to remove the first insulating layer.

In some embodiments, chemical mechanical polishing is used to remove the conductive material and the first insulating layer from the first major surface.

In some embodiments, both the conductive material and the first insulating layer are removed from the first major surface by plasma etching.

The conductive material within the trench may be used in a transistor device according to one of the embodiments described herein to provide a field plate arranged within the trench formed in the semiconductor substrate.

If the semiconductor device is a transistor device, the semiconductor substrate may have the first conductivity type for example n-type, and forms the drift region. A drain region of the first conductivity type may be formed at the second major surface of the semiconductor substrate that opposes the first major surface. A body region of the second conductivity type, e.g. p-type, that opposes the first conductivity type is formed on the drift region and a source region of the first conductivity type is formed on and/or in the body region. The source region and the body region may be formed by implantation of suitable dopants into the first major surface of the semiconductor substrate. The source and body region may be formed before or after the formation of the trench and the field plate and dielectric structure within the trench.

The method may also be used to fabricate a transistor device having the relative dimensions of the field plate and pillar as set out in one of the embodiments described herein. For example, in some embodiments the cap has a thickness x, the field plate has a height f and the cap overlaps the field plate by a distance v1, wherein $f*0.1 \le v_1 \le f*0.8$ or $f*0.3 \le v_1 \le f*0.6$, and/or the pillar spaces the field plate is spaced apart from the base of a trench by a height a and the cavity has a base that vertically overlaps with pillar by a distance b, wherein $b \ge a*0.6$ or $b \ge a*0.8$.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1A:
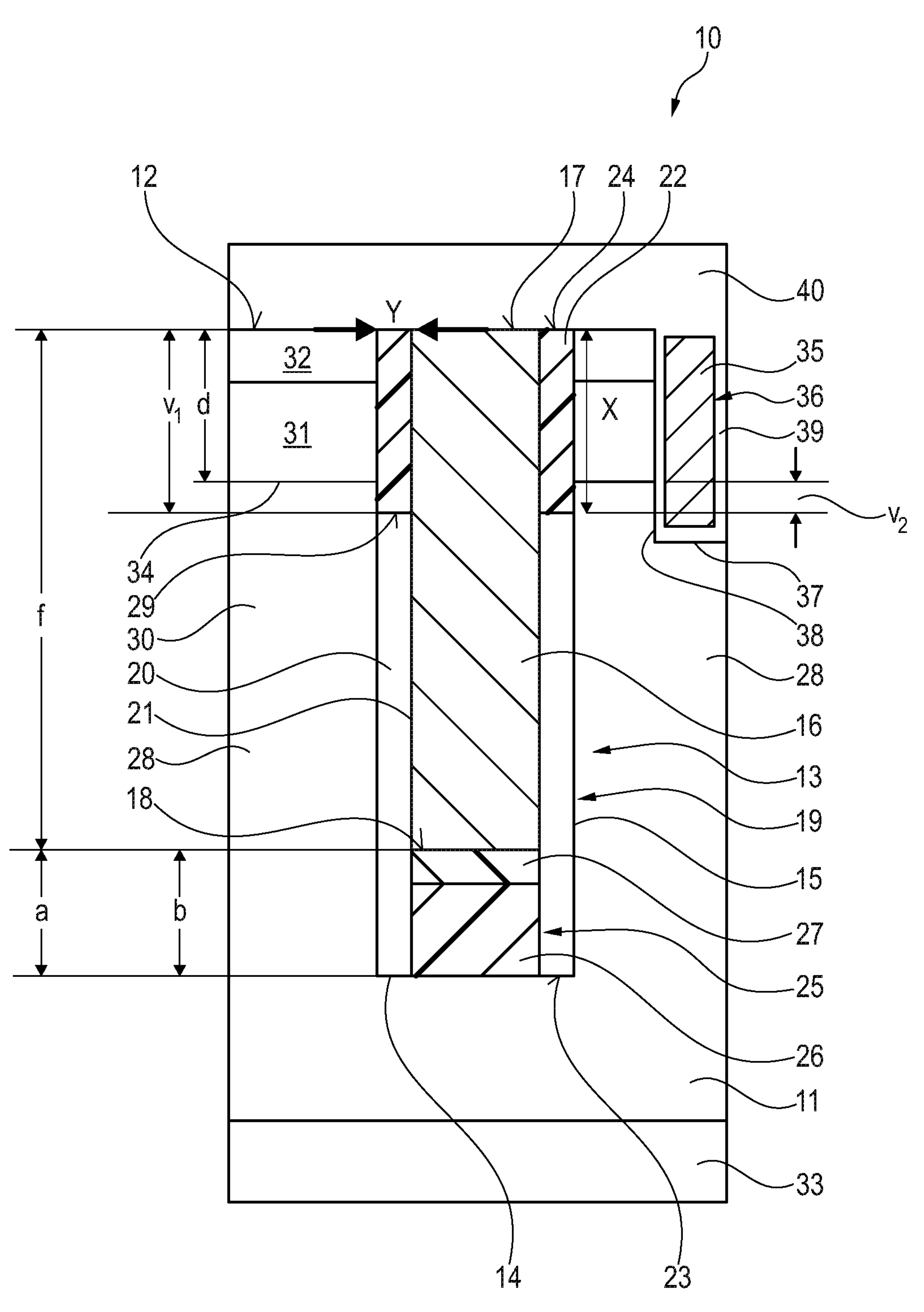
FIG. 1A illustrates a cross-sectional view of a semiconductor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

In some embodiments, the semiconductor device is a transistor device and may be a MOSFET (Metal Oxide Semiconductor Field Effect Transistor) device, an insulated gate bipolar transistor (IGBT) device or a Bipolar Junction Transistor (BJT). The transistor device may be a vertical transistor device with a drift path that extends substantially perpendicularly to the major surfaces of the device.

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

FIG. 1A illustrates a cross-sectional view of a semiconductor device 10 which comprises a semiconductor substrate 11 having a first major surface 12 and a trench 13 extending from the first major surface 12 into the semiconductor substrate 11. The trench 13 has a base 14 and sidewall 15 which extends from the base 14 to the first major surface 12. The sidewall 15 extends from the periphery of the base and entirely surrounds the periphery 14 of the base 14.

In some embodiments, the trench 13 has an elongate stripe-like form with the longest direction extending into the plane of the drawing. In these embodiments, the side wall 15 has four side wall sections with adjoining sections extending substantially perpendicularly to one another to form a rectangular striped trench 13.

In other embodiments, the trench 13 has a columnar or needle type shape. If the columnar trench is circular in plan view, it has a single side wall. If the columnar trench is, for example square or hexagonal in plan view, the side wall of the columnar trench has four and six side wall sections, respectively, whereby adjoining sections extend at an angle to one another, e.g. substantially perpendicularly or around 60°.

The side wall 15 of the trench 13 may extend substantially perpendicularly to the first major surface 12 or the trench 15 may taper slightly such that the base 14 has a smaller area than the opening of the trench 13 at the first major surface 12. The base 14 of the trench 13 may be substantially parallel to the first major surface 12 or have a concave form.

An electrically conductive field plate 16 is arranged in the trench 13 and has a height f. In this embodiment, an upper surface 17 of the field plate 16 is substantially coplanar with the first major surface 12 of the semiconductor substrate 11. In this embodiment, the lower surface 18 of the field plate 16 is therefore positioned at a distance from the first major surface 12 that corresponds to the height f of the field plate.

The field plate 16 is formed of electrically conductive material such as n-doped polysilicon and is electrically insulated from the semiconductor substrate 11 by a dielectric structure 19 which is arranged in the trench 13.

The dielectric structure 19 comprises a first portion 20 arranged in a lower portion of the trench 13 and a second portion 22 arranged in an upper portion of the trench 13. The first portion 20 of the dielectric structure 19 comprises a dielectric having a first dielectric constant and the second portion 22 of the dielectric structure 19 comprises a dielectric having a second dielectric constant that is higher than the first dielectric constant. In some embodiments, the first portion 20 of the dielectric structure 19 is formed by an enclosed and sealed cavity and the second portion 22 of the dielectric structure 19 provides a cap or plug that is positioned within the trench 13 and that seals the cavity.

Referring to FIG. 1A, the dielectric structure 19 comprises an enclosed and sealed cavity 20 which is laterally positioned between a sidewall 21 of the field plate 16 and the sidewall 15 of the trench 13. The cavity 20 is sealed at the top by a cap 22 formed of a dielectric material which is solid. In this embodiment, the base of the cavity 12 is formed by a peripheral region 23 of the base 14 of the trench 13 that is uncovered by the field plate 16. The cavity 20 is, therefore, bounded by the lower surface 29 of the cap 22 of solid dielectric material at the top, the sidewall 21 of the electrically conductive material of the field plate 16 at its inner side and the sidewall 15 of the trench 13 at its opposing outer side and at the base by the peripheral region 23 of the base 14. The side wall 15 and peripheral region 23 of the trench 13 are provided by the semiconductor material of the substrate 11, e.g. silicon. The cavity 20 laterally and continuously surrounds the field plate 16 within the trench 13. The cavity 20 is free of solid material and may be filled by a gas or vacuum, for example, the atmosphere of the processing chamber during the process in which the cap 22 is formed. The cavity 20 may also be considered to be a void that is formed in the dielectric structure 19.

In some embodiments, the sidewall 15 of the trench, the sidewall 21 of the field plate 16 and the peripheral region 23 of the base 14 of the trench are covered by a solid dielectric material, for example silicon oxide, in the form of a lining or liner layer which bounds the cavity 20.

The cap 22 has a maximum thickness or height x between its upper surface 24 and lower surface 29 in a direction which is substantially perpendicular to the first surface 12 and parallel to the height f of the field plate 16. In this embodiment, the upper surface of the cap 22 is substantially coplanar with the first major surface 12 so that the thickness x of the cap 22 is measured with respect to the first major surface 12. The cap 22 extends between fills the space between the sidewall 21 of the field plate 16 and the sidewall 15 of the trench 13 in the upper portion of the trench 13. The cap 22 has a breadth y which corresponds to the distance between the sidewall 15 of the trench 13 and the sidewall 21 of the field plate 16.

The cap 22 is positioned only within the upper portion of the trench 13. In this embodiment, the cap 22 extends into the trench 13 from the first major surface by a distance x which corresponds to the thickness of the cap 22. The cap 22, therefore overlaps the height of the field plate 16 in a direction which is substantially perpendicular to the first major surface 12 of the substrate 11 and can be considered to vertically overlap the field plate 16. The cap 20 overlaps the height of the field plate 16 by a distance $v_1$, whereby $f*0.1 \le v_1 \le f*0.8$ or $f*0.3 \le v_1 \le f*0.6$. The minimum overlap of the height of the field plate 16 by the cap is 10%. This provides a reliable seal for the cavity 20 and assists in securing the position of the field plate 16 within the trench 13. This overlap may be increased up to 80% of the height of the field plate 16 so that at least 20% of the height of the field plate 16 is surrounded by a cavity 20.

In this embodiment, the overlapping distance $v_1$ corresponds to the thickness x of the 22, i.e. $x=v_1$, since the upper surface of the 22 and the upper surface 17 of the field plate 16 are substantially coplanar with the first major surface 12. The overlapping distance $v_1$, may, however, differ from the thickness x of the cap 22 in embodiments in which, for example, the upper surface 17 of the field plate 16 is positioned within the trench 13 and spaced at a distance from the first major surface 12 and/or in embodiments in which the upper surface 24 of the cap 22 protrudes above the first major surface 12.

The solid dielectric material of the cap 22 has, in some embodiments, a higher dielectric constant than the dielectric constant of the cavity. For example, if the cavity 20 includes a vacuum, a vacuum has a dielectric constant of around 1. The cap 22 may be formed of silicon oxide, e.g. silicon dioxide, which has a dielectric constant of around 3.9. In this embodiment, the dielectric constant of the dielectric structure 19 within the trench 13 increase from the lower surface 18 to the upper surface 17 of the field plate 16.

The solid dielectric material towards the upper part of the field plate 16 enables the semiconductor substrate 11 in the region adjoining the first major surface 12 to have a higher doping level. At the same time, the pitch of the trenches 13 can be reduced, since the cavity 20 in the lower part of the trench 13 enables the thickness of the dielectric structure 19 in a lateral direction to be reduced and consequently, the pitch between trenches to be reduced. This combination of features enables an improvement in the parameter Ron (on resistance)×A, a reduction the gate drain capacitance and an improved the breakdown voltage of the device.

In some embodiments, such as that illustrated in FIG. 1A, the dielectric structure 19 which electrically insulates the field plate 16 from the semiconductor substrate 11 further comprises a pillar 25 of solid dielectric material which is positioned between the lower surface 18 of the field plate 16 and the base 14 of the trench 13. In some embodiments, the pillar 25 may have a width and a length which substantially corresponds to the width and length of the field plate 16. The pillar 25 has a height a. The sum of the height a of the pillar 25 and the height f of the field plate 16 may correspond to the depth of the trench 13, that is the distance between the base 14 and the first major surface 12. The cavity 20 overlaps the pillar 25 of solid dielectric material in the same direction as the overlap $v_1$ between the solid dielectric 22 and the field plate 16. In some embodiments, the cavity 20 overlaps the height a of the pillar 25 by distance b, whereby b≥a*0.6 or b≥a*0.8. In other words the cavity 20 overlaps 60% to 100% of the height of the pillar 25 or 80% to 100% of the height of the pillar 25. In embodiments in which the base of the cavity 20 is formed by the peripheral region 23 of the base 14 of the trench 13, a=b.

In other embodiments, the peripheral region 23 of the base 14 is covered by a layer of solid dielectric material which has a thickness as measured from the base 14 which is less than the thickness a of the pillar 25, in these embodiments, the base of the cavity 20 is spaced apart from the base 14 of the trench 13 by distance (a−b) which lies in the range of 0≤(a−b)≤a*0.4.

The cavity 20 laterally and continuously surrounds the field plate 16 within the trench 13. In some embodiments, the cavity 20 is also positioned between the base 18 of the field plate 16 and the base 14 of the trench 13. In other words, the pillar 25 of solid dielectric material may be omitted. The vertical overlap between the cap 22 and the upper portion of the field plate 16 serves to not only seal the cavity 20 but also to anchor the field plate 16 in position within the trench, particularly in embodiments in which the pillar 25 is omitted.

The field plate 16 is formed of an electrically conductive material, typically polysilicon. The semiconductor substrate 11 is typically formed of silicon and the solid dielectric material forming the cap 22 may be silicon oxide. The pillar 25 may also be formed of silicon oxide. In some embodiments, the pillar 25 is formed of two sublayers 26, 27 which may have the same or differing compositions.

The semiconductor device 10 is, in the embodiment illustrated in FIG. 1A, a transistor device. However, the arrangement of the trench 13, electrically conductive field plate 16 and the dielectric structure 19 comprising the cavity 20 and cap 22, which electrically insulates the field plate 16 from the semiconductor substrate 11, may be used to in other types of semiconductor devices. In some semiconductor devices, the field plate 16 is not used as a field plate 16 but uses the more general properties of an electrically conductive material and the dielectric properties of the dielectric structure 19. For example, the arrangement may be used to form a capacitor.

In the embodiment illustrated in FIG. 1A, the semiconductor device 10 is a transistor device. The semiconductor substrate 11 comprises a drift region 30 of the first conductivity type, for example n-type, a body region 31 of a second conductivity type which opposes the first conductivity type, for example p-type if the drift region is n-type, which is arranged on the drift region 30 and source region 32 formed of the first conductivity type which is arranged on and/or in the body region 31. The semiconductor device 10 further includes a drain region 33 of the first conductivity type which is arranged below the base 14 of the trench 13. In these embodiments, the transistor device 10 is a vertical transistor device, for example a vertical MOSFET device.

The body region 31 forms a pn junction 34 with the underlying drift region 30 which is positioned at a distance d from the first major surface 12. In some embodiments, the lower surface 29 of the cap 22 is positioned at a distance x from the first major surface 12 within the trench 13 and the distance x is greater than the distance d of the pn junction 34 from the first major surface 12. In other words, the cap 22 vertically the overlaps the source region 32, the body region 31 and extends beyond the position 34 of the pn junction 34 by a distance $v_2$. The cap 22 vertically overlaps the drift region 30 by the distance $v_2$.

The transistor device also comprises a gate electrode 35 which is positioned in a gate trench 36 which extends from the first major surface 12 into the semiconductor substrate 11. The gate trench 36 also has a base 37 and sidewalls 38 which extend from the base 37 to the first major surface 12. The gate electrode 35 is formed of conductive material, for example polysilicon, and is electrically insulated from the semiconductor substrate 11 by a gate dielectric 39 which lines the base 37 and sidewalls 38 of the gate trench 36.

The trench 13 is one of a plurality of trenches which are arranged in a regular array and spaced apart from one another by a mesa 28 formed by the semiconductor substrate 11. In embodiments in which the trenches 13 each have an elongate strip-like shape, the trenches 13 extend substantially parallel to one another and a stripe-like mesa 28 is formed between the side walls of adjacent trenches 13. In embodiments in which the trenches 13 have a columnar or needle-shape, the trenches 13 may be arranged in an array of rows and columns or off-set rows, for example. The mesa 28 comprises the drift region 30, body region 31 and source region 32. The gate trench 36 is positioned in the mesa 28 and is laterally spaced apart from neighbouring ones of the trenches 13.

The upper surface 12 of the substrate 11 may be covered by an electrically insulating layer 40 which forms a part of the frontside metallisation structure and which covers the upper surface 17 of the field plate 16 and the gate electrode 35 in addition to the first major surface 12. Contacts are made to the field plate 16, the gate electrode 35 and the mesa 28 which are positioned in a different plane of the semiconductor device 10 and cannot be seen in the cross-sectional view of FIG. 1A.

Figure 1B:
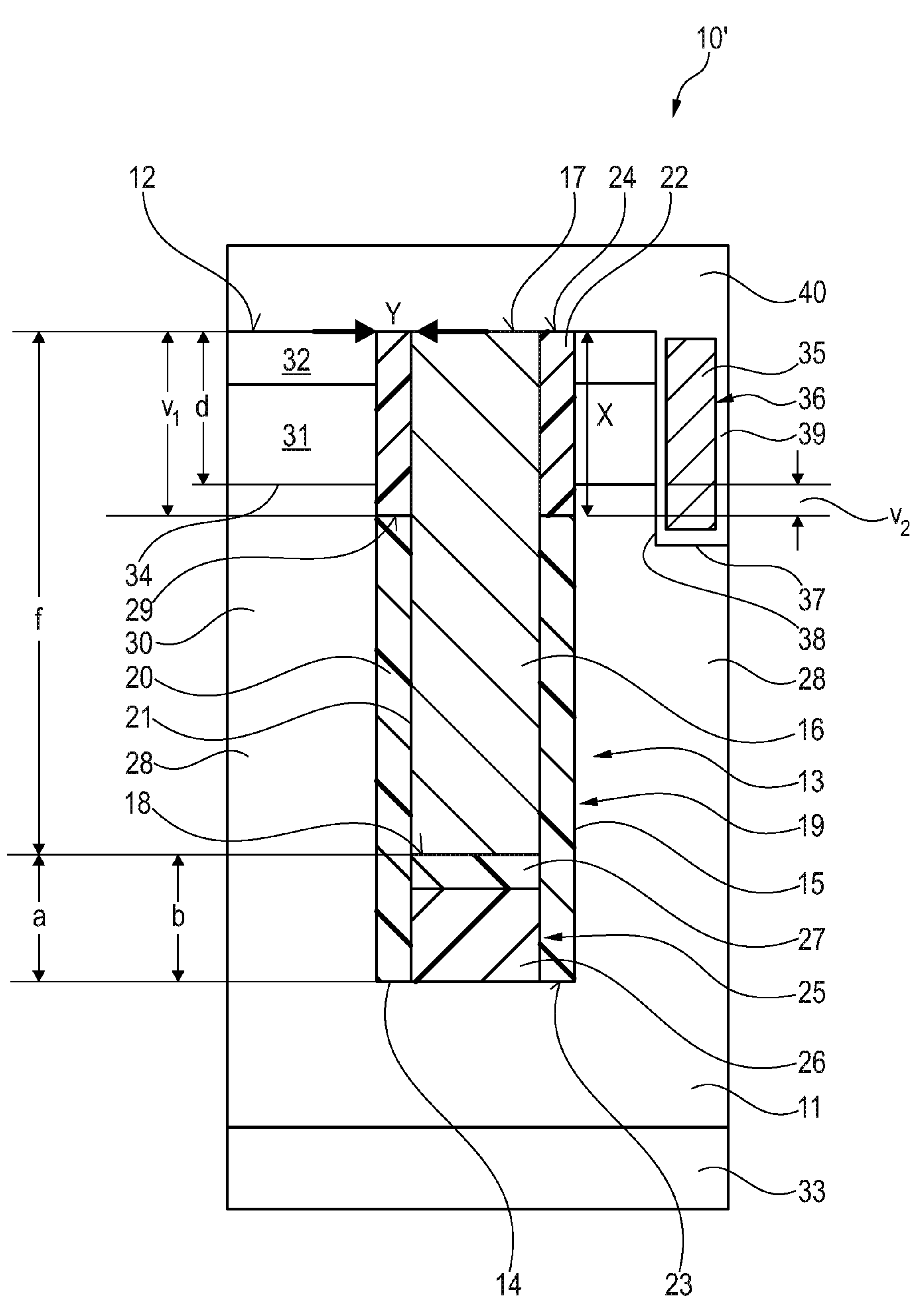
FIG. 1B illustrates a cross-sectional view of a semiconductor device according to an embodiment.

FIG. 1B illustrates a cross-sectional view of a semiconductor device 10' according to an embodiment which differs from the semiconductor device 10 illustrated in, and described with reference to, FIG. 1A in the material of the first portion 20 of the dielectric structure 19 that is formed within the trench 13. In the semiconductor device 10', the first portion of the dielectric structure 19 comprises a dielectric material in the solid state rather than a cavity. The first portion 20 of the dielectric structure 19 comprises a dielectric having a first dielectric constant and the second portion 22 of the dielectric structure 19 comprises a dielectric having a second dielectric constant that is higher than the first dielectric constant.

In some embodiments, the lower first portion 20 of the dielectric structure 19 comprises an oxide, e.g. silicon dioxide, and the upper second portion 22 of the dielectric structure 19 comprises a so-called HighK dielectric. A HighK dielectric material has a higher dielectric constant (K, kappa) compared to silicon dioxide. Examples of a HighK dielectric material include hafnium silicate, zirconium silicate, hafnium dioxide and zirconium dioxide.

The dielectric structure 19 is not limited to having two portions 20, 22 comprising dielectric materials of differing dielectric constant but may include more than two portions. In some embodiments, the dielectric structure 19 further comprises one or more intermediate portions of the dielectric structure 19 that are arranged vertically between the lower first portion 20 of the dielectric structure 19 and the upper second portion 22 of the dielectric structure 19 and that comprise a material with a dielectric constant that is intermediate that of the first and second portions 20, 22 of the dielectric structure 19. The dielectric constant of the dielectric structure 19 within the trench 13 increases in the direction from the base 14 of the trench 13 to the first major surface 12 of the semiconductor substrate 11.

FIGS. 2A to 2J illustrate a method for fabricating a sealed cavity in a trench according to an embodiment. The method may be used to fabricate the semiconductor device of any one of the embodiments described herein including the semiconductor device 10 shown in FIG. 1A with the field plate 16 arranged in the trench 13 and electrically insulated from the semiconductor substrate 11 by the dielectric structure 19 including the vacuum-filled or gas-filled cavity 20 and the cap 22 of solid dielectric material.

The method may be carried out before the fabrication of the body region 31 and source region 32, for example by implantation of suitable dopants into the semiconductor substrate 11, or the body region 31 and source region 32 may first be formed by implantation of dopants into the semiconductor substrate 11 and then the trench 13 is formed. The gate trench 36 and gate electrode 35 with its gate dielectric 39 may be formed using some of the processes used to form the trench 13 for the field plate 16.

Figures 2A, 2B, 2C, 2D:
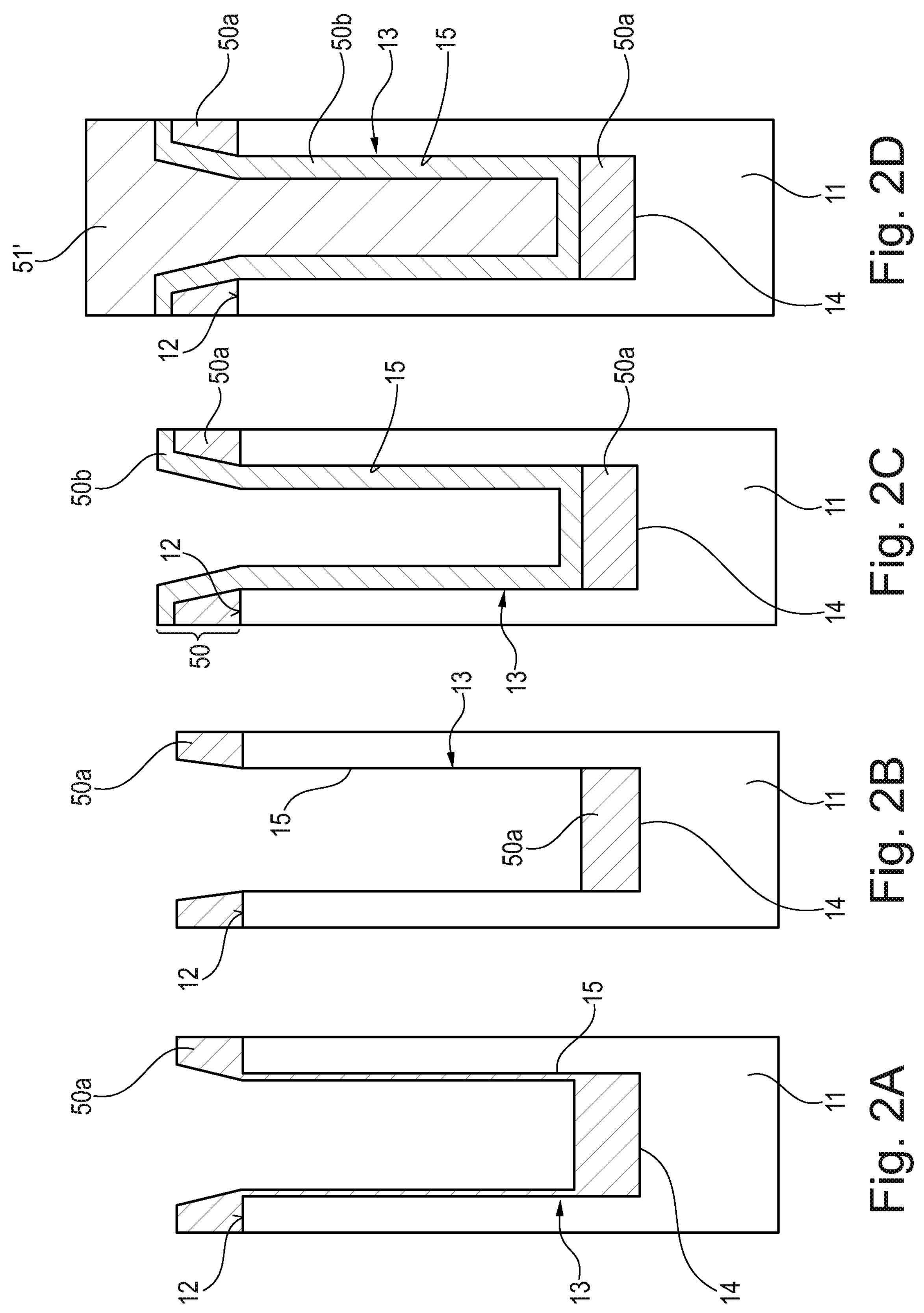
FIGS. 2A to 2J illustrate a method of fabricating a semiconductor device according to an embodiment.

Referring to FIG. 2A, a trench 13 is formed in the upper surface 12 of the semiconductor substrate 11 and is lined with a first insulating sublayer 50*a* which extends over the first major surface 12 of the semiconductor substrate 11 and over the sidewall 15 and base 14 of the trench 13. The thickness of the first insulating sublayer 50*a* may be greater on the horizontal surfaces, that is the first major surface 12 of the semiconductor substrate 11 and the base 14 of the trench 13, than on the vertical surfaces, that is the sidewall 15 of the trench 13. The first insulating sublayer 50*a* may be formed by thermal oxidation or high density plasma deposition and may comprise silicon oxide.

Referring to FIG. 2B, the first insulating sublayer 50*a* is removed entirely from the sidewalls 15 of the trench 13 and partially from the base 14 of the trench 13 such that its thickness on the base 14 of the trench 13 is reduced. The first insulating sublayer 50*a* remains on the first major surface 12 and on the base 14 of the trench 13 but its thickness may be reduced. The first insulating sublayer 50*a* may be removed by wet etching.

Referring to FIG. 2C, a second insulating sublayer 50*b* is deposited which covers the first insulating sublayer 50*a* on the first major surface 12, the sidewall 15 and the remainder of the first insulating sublayer 50*a* positioned on the base 14 of the trench 13. The second insulating sublayer 50*b* may be conformally deposited and may be deposited using Atomic Layer Deposition (ALD). The first and second insulating sublayers 50*a*, 50*b* may comprise silicon dioxide. The first and second insulating sublayers 50*a*, 50*b* form a first insulating layer 50 which covers the first major surface 12, the base 14 and sidewall 15 of the trench 13. The first insulating layer 50 has a greater thickness on the base 14 than on the side wall 15 of the trench 13. In some embodiments, the first insulating layer 50 may be formed of a single layer rather than the two sublayers 50*a*, 50*b* shown in the embodiment illustrated in FIGS. 2A through 2J.

Referring to FIG. 2D, conductive material 51 is then inserted into the trench 13 and fills the trench 13 and also extends over the first insulating layer 50 arranged on the first major surface 12 of the semiconductor substrate 11. The conductive material 51 may be polysilicon, for example polysilicon highly doped with the first conductivity type. Highly doped polysilicon may be deposited using LPCVD (Low Pressure Chemical Vapour Deposition).

Figures 2E, 2F, 2G, 2H:
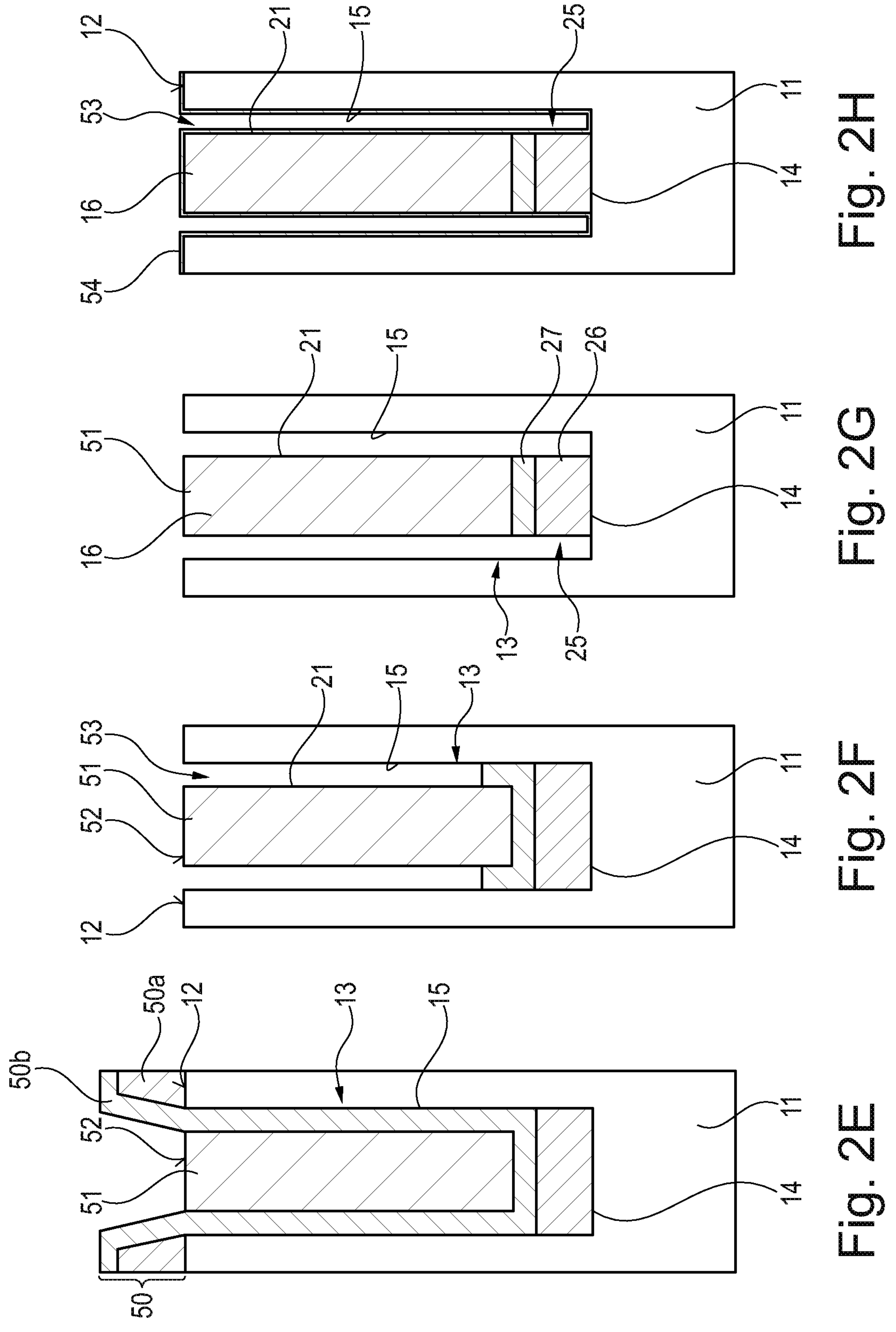

Referring to FIG. 2E, in some embodiments, after the conductive material 51 is inserted into the trench 13, a planarization process is carried out. The planarization process may be carried out using various methods. In one embodiment, the planarization process comprises selectively plasma etching the conductive material 51 or a combination of chemical mechanical polishing to remove the conductive material 51 from the first major surface 12 followed by plasma etching to remove the underlying first insulating layer 50 from the first major surface 12. In an embodiment, chemical mechanical polishing is used to remove the conductive material 51 and the first insulating layer 50 from the first surface 12. In another embodiment, both the conductive material 51 and the first insulating layer 50 may be removed from the first surface 12 by plasma etching.

The conductive material 51 is selectively removed such that it has an upper surface 52 which is substantially coplanar with the first major surface 12 of the semiconductor substrate 11 to form a field plate 16 in the trench 13. The conductive material 51 is, therefore, removed from the first insulating layer 50 arranged on the first major surface 12 such that an opening is formed in the first insulating layer 50 with the upper surface 52 of the conductive material 51 at its base. The first insulating layer 50 may then be entirely removed from the first major surface 12.

Referring to FIG. 2F, the second insulating sublayer 50*b* is then selectively removed from the upper portion of the trench 13 exposing the sidewalls 15 of the trench and upper portion of the conductive material 51 and forming a recess 53 which laterally surrounds the upper portion of the conductive material 51 within the trench 13. The base of the peripheral recess 53 is formed by a portion of the first insulating layer 50 remaining in the trench 13 which vertically overlaps sidewall 21 of the conductive material 51 at the base. The second insulating sublayer 50*b* may be selectively removed over the conductive material 51 and the semiconductor substrate 111 by wet etching or plasma etching or wet etching followed by plasma etching.

The method continues, as shown in FIG. 2G, by selectively removing the portions of the first insulating layer 50, which are positioned laterally adjacent to the conductive material 51 such that a pillar 25 of dielectric material is formed from the remainder of the first insulating layer 50. In this embodiment, the pillar 25 comprises two the sublayers 50*a*, 50*b* of the first insulating layer 50. The pillar 25 may have lateral dimensions, i.e. a width and a length, which correspond to the lateral dimensions of the conductive material 15. The recess 53 now extends from the first major surface 12 to the base 14 of the trench such that the peripheral regions 23 of the base 14 are uncovered by the first insulating layer 50.

In some embodiments, a thin dielectric layer 54 is deposited which covers the first major surface 12, the sidewalls 15 and peripheral region 23 of the base 14 of the trench 13, the sidewall of the pillar 25 and the sidewall 21 and upper surface 59 of the conductive material 51, as illustrated in FIG. 2H. This dielectric liner layer 54 may be used to assist in improving the adhesion between the material of the cap and materials of the conductive material 51 and semiconductor substrate 11 so as to provide a good seal for the cavity within the trench 13. The dielectric liner layer 54 may be formed by thermal oxidation and/or deposition and may comprise silicon oxide.

Figure 2J:
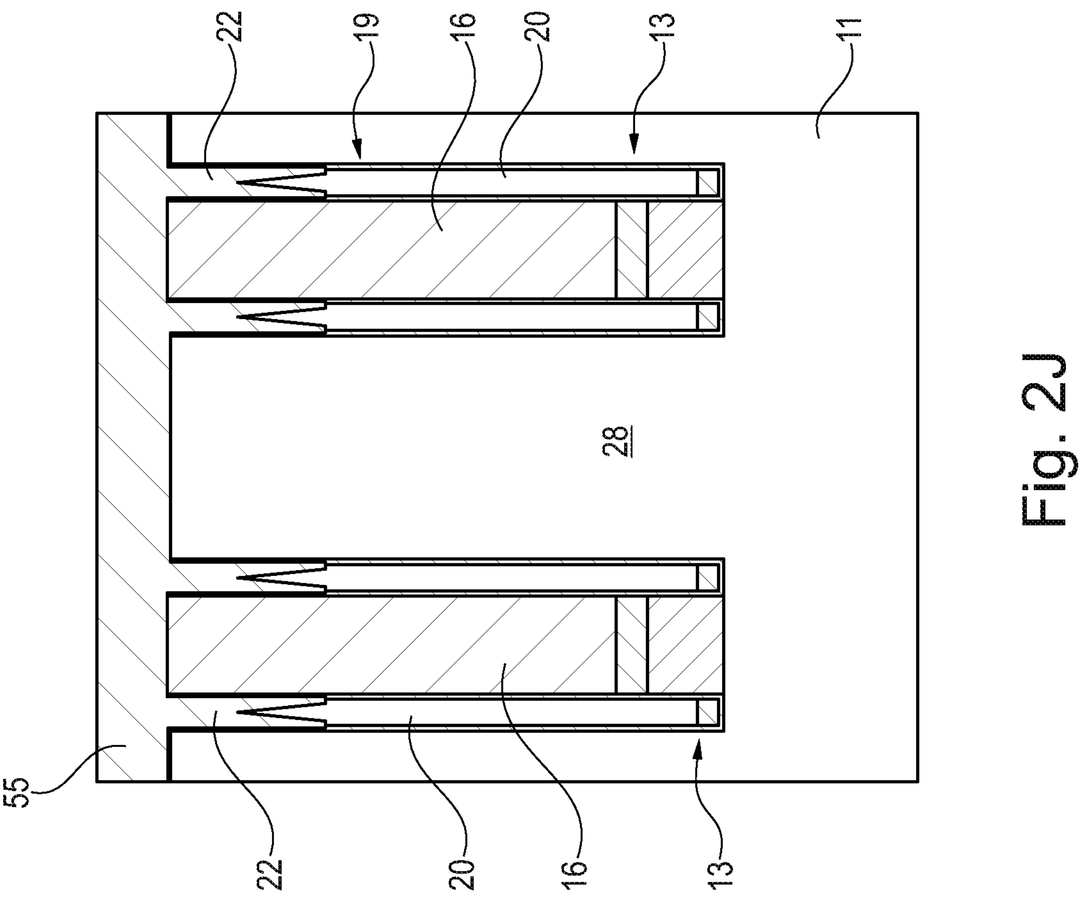
Figure 2I:
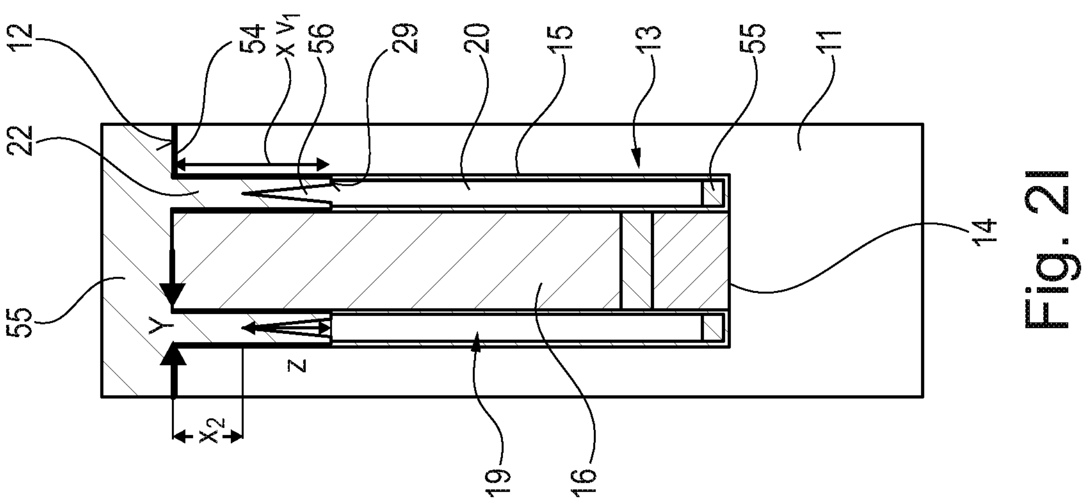

Referring to FIG. 2I, a second insulating layer 55 is deposited onto the first major surface which extends into the upper portion of the trench 13 and which forms the cap 22. The second insulating layer 55 extends into the trench 13 by a maximum distance x from the first surface 12 and overlaps the upper portion of the conductive material 51 forming the field plate 16 by a distance $v_1$. In some embodiments, the lower surface 29 of the cap 22 is not horizontal as depicted in the schematic view of FIGS. 1A and 1B but includes an indentation 56 or up turned V or U-form such that the cap 22 has a maximum thickness x from the first major surface 12 along the sidewall 15 of the trench 13 and the sidewall 21 of the field plate 16 which is greater than its thickness $x_2$ from the first major surface 12 at a point intermediate the width of the cap 22. This indentation 56 may have a height z. This form of the lower surface 29 of the cap 22 may arise due to preferential growth of the second insulating layer 55 on the sidewall 15 of the trench 13 and sidewall 21 of the field plate 16.

In some embodiments, some of the second insulating layer 55 is also deposited on the peripheral regions 23 of the base 14 of the trench 13, as shown in FIG. 2I, such that the base of the cavity 20 is formed by the second insulating material positioned on the base 14 of the trench 13. The cavity 20 has an upper side that is formed by the second insulating material forming the cap 22 and vertical sides extending between the second insulating layer 55 on the base 4 of the trench 13 and the lower surface 19 of the cap 22 by the dielectric layer 54 which lines the sidewall 15 of the trench 13, the sidewall 21 of the field plate 16 and the side wall of the pillar 25. The second insulating layer 55 extends between the dielectric layer 54 positioned on the side wall 15 of the trench and the side wall 21 of the conductive material 51. The second insulating layer 55 may be deposited using ALD or CVD, for example and may be formed of silicon oxide. FIG. 2J shows a larger portion of the semiconductor substrate 11 which includes two neighbouring trenches 13 and the mesa 28 formed between them.

The deposition conditions for forming the second insulating layer 55 can be controlled in order that the second insulating layer 55 is deposited at the top of the trench and optionally only to a smaller extent at the base 14 of the trench so as to form the cavity 20 within the trench 13. For ALD deposition, in order to prevent material deposition in higher depth x the sticking coefficient of the precursor is elected so as to be large (close to 1). For example, a $Al_2O_3$ precursor (TMA) may be used. For CVD deposition, the height Z of the wedge or indentation 56 may be larger than in case of ALD.

The epitaxial doping profile of the semiconductor substrate 11 may be adjusted in order to further improve performance and device stability in dependence on the dielectric constant of the material used for the second insulating layer 55, the depth x of the cap 22 and the shape of the indentation and the width Y and consequently the height of the cavity 20 and its vertical position with respect to the field plate 16.

FIGS. 3A to 3K illustrate a method for forming a sealed cavity in a trench according to another embodiment. This method may be used for fabricating the semiconductor device 10 according to the embodiments described herein including the semiconductor device illustrated in FIGS. 1A and 1B. The method described with reference to FIGS. 3A to 3K differs from the method described with reference to FIGS. 2A to 2J in the fabrication of the first insulating layer 50.

Figures 3A, 3B, 3C, 3D:
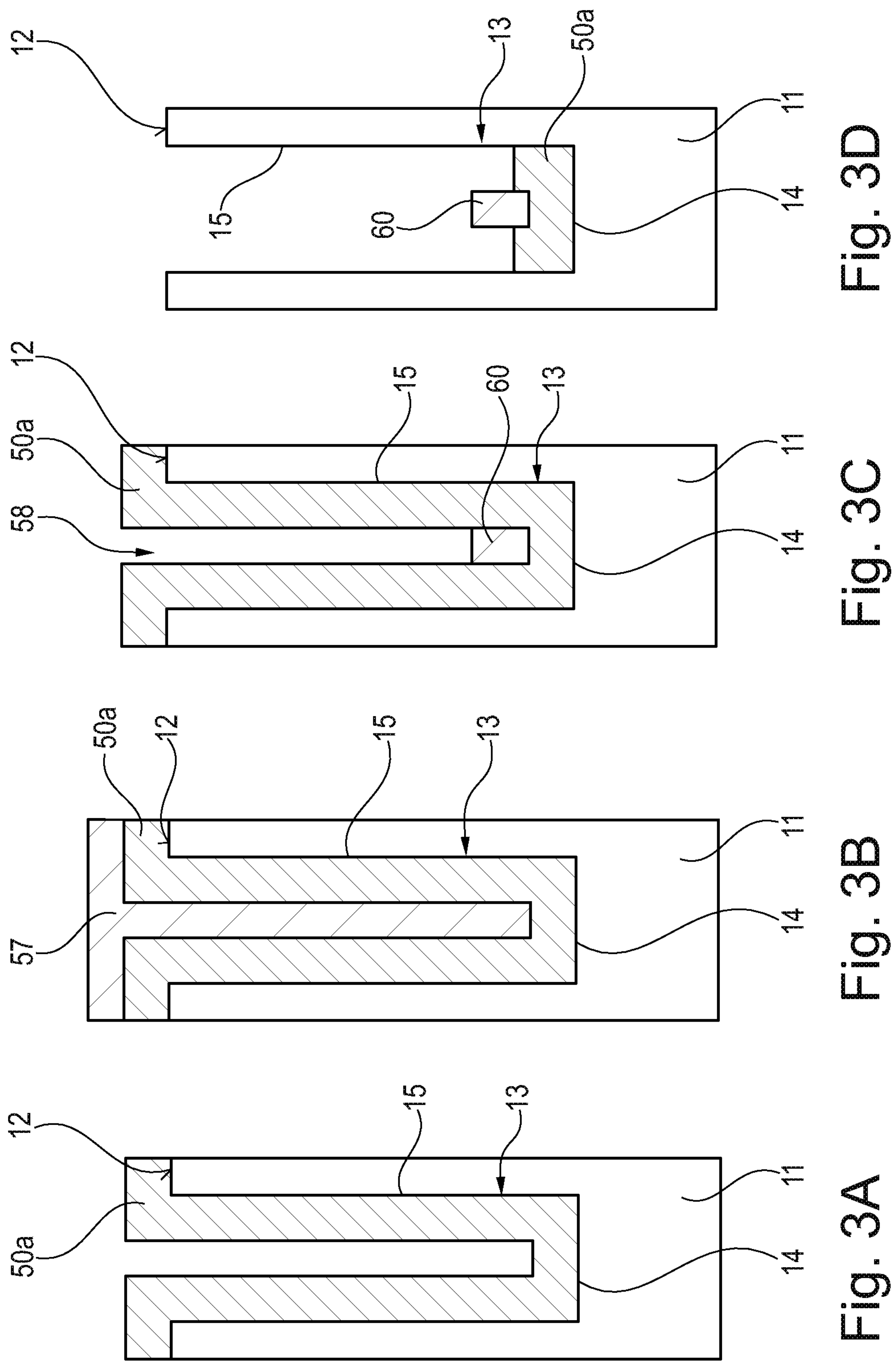
FIGS. 3A to 3K illustrate a method of fabricating a semiconductor device according to an embodiment.

Referring to FIG. 3A, a trench 13 is formed in the first surface 12 of the semiconductor substrate 11, for example by etching, and a first insulating sublayer 50*a* is formed which lines the sidewalls sidewall 15 and base 14 of the trench 13 and which extends over the first major surface 12 of the semiconductor substrate 11. The first insulating sublayer 50*a* may be formed by thermal oxidation and/or deposition and may comprise silicon oxide.

Referring to FIG. 3B, a sacrificial material 57 is then deposited which fills the trench 13. The sacrificial material 57 may also extend over the first major surface 12. The sacrificial material 57 is formed of a material that is selectably etchable over the material of the semiconductor substrate, e.g. silicon, and also over the material of the first insulating sublayer 50*a*, e.g. silicon oxide. The sacrificial material may be carbon, a photoresist or a nitride, for example.

The sacrificial material 57 is selectively removed to form a recess 58 in the centre of the trench 13. A portion of the sacrificial material 57 remains at the base of the trench 13 to form a plug 60, as can be seen in FIG. 3C. The entire sidewall 15 of the trench 13 and the first major surface 12 are covered by the first insulating sublayer 50*a* at this stage. The removal of the upper portion of the sacrificial material 57 forms a central recess that is bounded at the sides by the first insulating sublayer 50*a* and at the base by the plug 60.

Referring to FIG. 3D, the first insulating sublayer 50*a* is then removed from the first major surface 12 and the sidewall 15 of the trench 13. The first insulating sublayer 50*a* may be removed entirely from the first major surface 12 of the semiconductor substrate 11 and from the side wall 15 of the trench 13 in the upper portion of the trench 13. A portion of the first insulating sublayer 50*a* remains in the base 14 of the trench 13. The first insulating sublayer 50*a* may also be removed such that a portion of the plug 60 is revealed and protrudes from the remaining portion of the first insulating sublayer 50*a* positioned at the base 14 of the trench 30. A wet etch may be used. The plug 60 is then removed such that the base 14 of the trench 13 is covered by the remainder of the first insulating layer 50*a* and includes an indentation in its upper surface which was previously filled by the plug 60.

Figures 3E, 3F, 3G, 3H:
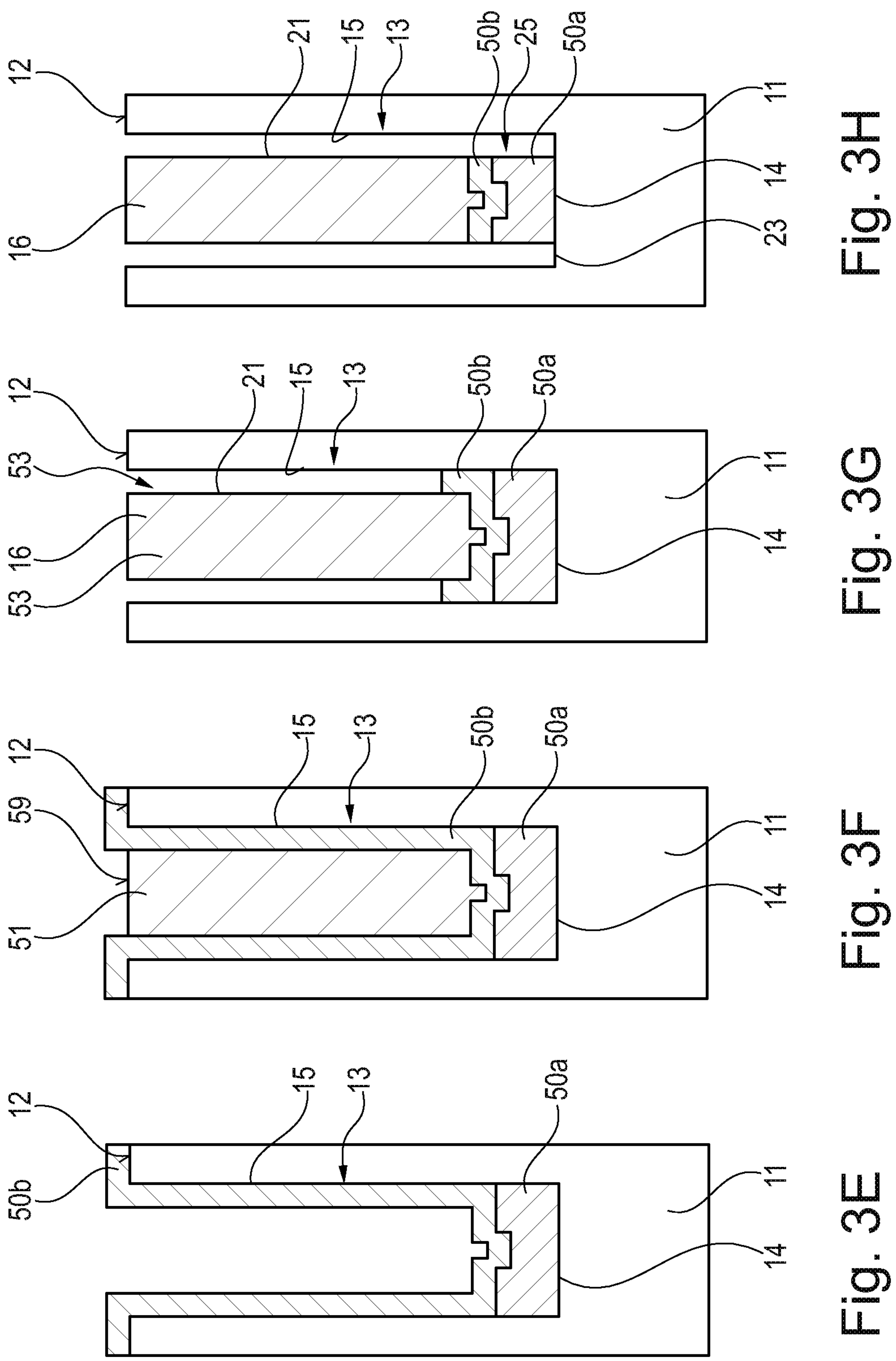

Referring to FIG. 3E, a second insulating sublayer 50*b* is then formed which covers the first major surface 12 of the substrate 11, the exposed sidewall 15 of the trench 13 and the upper surface of the first insulating sublayer 50*a* remaining on the base 14 of the trench 13, The second insulating layer 50*b* may be deposited using Atomic Layer Deposition (ALD) and may be formed of silicon oxide. In some embodiments, the second insulating layer 50*b* is also formed on the first major surface 12.

Referring to FIG. 3F, conductive material 51 is then inserted into the conductive into the trench 13 so as to fill the trench 13. The conductive material 51 may have an upper surface 59 which is substantially coplanar with the first major surface 12. The conductive material 51 may be polysilicon, for example polysilicon highly doped with the first conductivity type.

In some embodiments, after the conductive material 51 is inserted into the trench 13, a planarization process is carried out. The planarization process may be carried out using various methods. In one embodiment, the planarization process comprises selectively plasma etching the conductive material 51 or a combination of chemical mechanical polishing to remove the conductive material 51 from the first major surface 12 followed by plasma etching to remove the second insulating sublayer 50*b* from the first major surface 12. In an embodiment, chemical mechanical polishing is used to remove the conductive material 51 and the second insulating sublayer 50*b* from the first surface 12. In another embodiment, both the conductive material 51 and the second insulating sublayer 50*b* may be removed from the first surface 12 by plasma etching.

Referring to FIG. 3G, the second insulating sublayer 50*b* is then removed from the first major surface 12 and upper portion of the trench 13 so as to expose sidewall 15 the trench and the sidewall 21 of the field plate 16 in the upper portion of the trench 13 and form the recess 53. The base of the field plate 16 is positioned within the first and second insulating sublayers 50*a*, 50*b* arranged in the lower portion of the trench 13. The second insulating sublayer 50*b* may be selectively removed over the conductive material 51 and material of the semiconductor substrate 11 by wet etching.

As shown in FIG. 3H, the remainder of the first and second insulating sublayers 50*a*, 50*b* is then removed from the peripheral region of the trench 13 to form the pillar 25. The pillar 25 is formed of the two sublayers 50*a*, 50*b*. The remainder of the first and second insulating sublayers 50*a*, 50*b* may be removed from the peripheral region 23 of the base 14 of the trench 13 to form the pillar 25 by carrying out an anisotropic etch. The first and second insulating sublayers 50*a*, 50*b* are removed entirely from the peripheral region 23 of the base 14 of the trench 13 while leaving the pillar 25 formed of the first and second sublayers 50*a*, 50*b* under the lower surface of the conductive material 51. Due to the formation of the indentation in the first insulating sublayer 50*a* by the plug 60, the base of the lower surface of the field plate 16 has a protruding portion which protrudes into the second insulating sublayer 50*b* which may provide a better mechanical interlocking between the field plate 16 and the pillar 25.

Figures 3I, 3J, 3K:
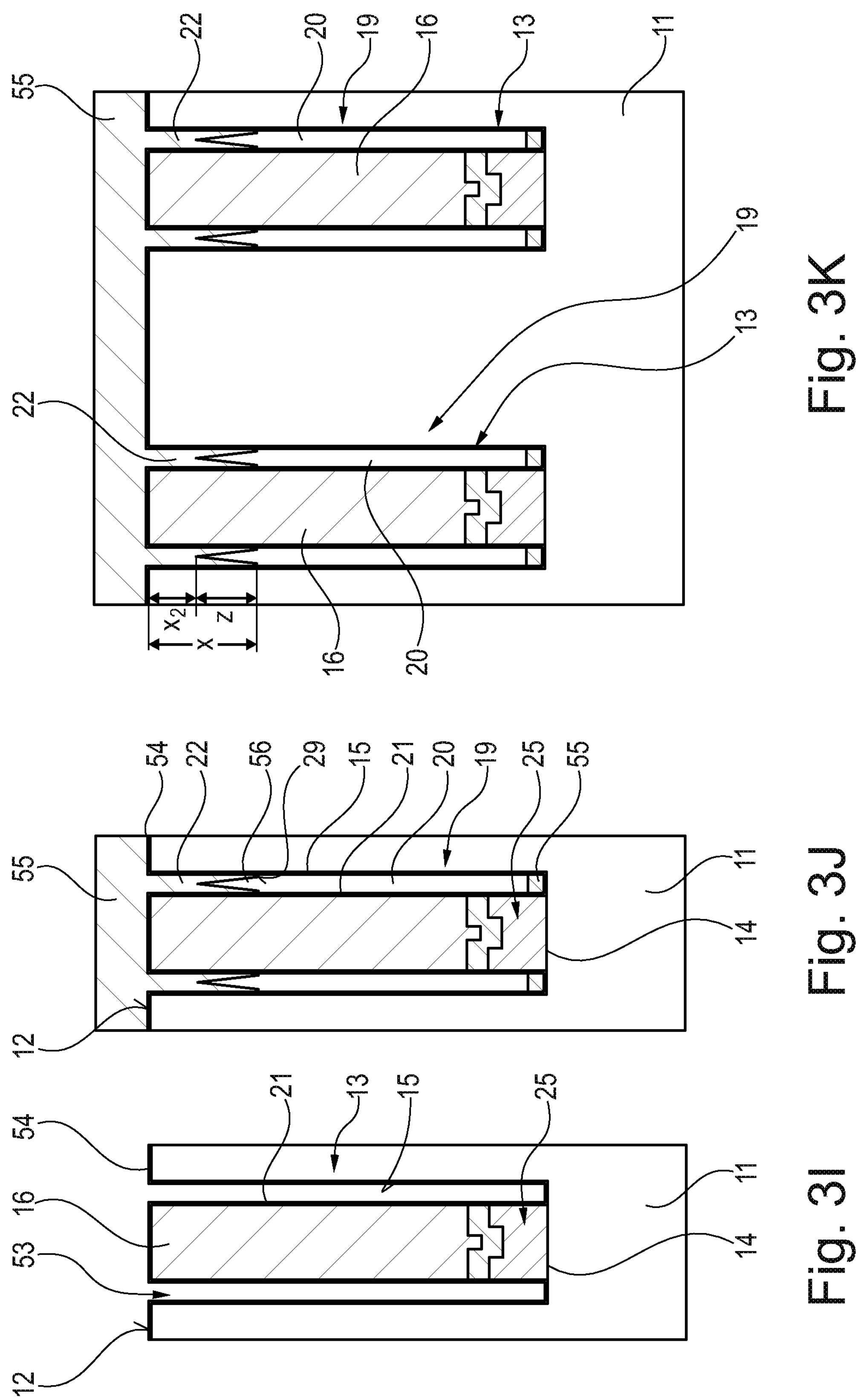

Optionally, the dielectric layer 54 may be deposited which lines the sidewall 55, peripheral region 23 of the base 14 of the trench 13 and which covers the sidewall of the pillar 25, the sidewall 21 of the field plate 16 and the first major surface 12, as illustrated in FIG. 3I. The dielectric layer 54 may be formed of an oxide, for example a silicon oxide and may be formed by thermal oxidation and/or deposition.

As shown in FIG. 3J, the second insulating layer 55 is then deposited to form the cap 22 in the upper portion of the trench and so as to seal the cavity 20. Similar to the structure for the cap 22 shown in FIG. 2I, the second insulating layer 55 and the cap 22 extends into the trench 13 by a maximum distance x from the first surface 12. The lower surface 29 of the cap 22 includes an indentation 56 or up turned V or U-form such that the cap 22 has a thickness x from the first major surface 12 along the sidewall 15 of the trench 13 and the sidewall 21 of the field plate 16 which is greater than its thickness x2 from the first major surface 12 at a point intermediate the width of the cap 22. This indentation may have a height z. This form of the lower surface 29 of the cap 22 may arise due to preferential growth of the second insulating layer 55 on the sidewall 15 of the trench 13 and sidewall 21 of the field plate 16.

In some embodiments, some of the second insulating layer 55 is also deposited on the peripheral regions 23 of the base 14 of the trench 13 such that the base of the cavity 20 is formed by this material. In the embodiment shown in FIG. 3J, the cavity 20 has a base formed by the second insulating material positioned on the base 14 of the trench 13, an upper side formed by the second insulating material forming the cap 22 and vertical sides by the dielectric layer 54 which lines the sidewall 15 of the trench 13, sidewall 21 of the field plate 16 and the side wall of the pillar 25. The second insulating layer 55 extends between the dielectric layer 54 positioned on the side wall 15 of the trench and the side wall 21 of the conductive material 51 at both the top and bottom of the cavity 20. FIG. 3K illustrates a view of the semiconductor device 10 and two trenches 13 and illustrates the mesa 28 formed between adjoining ones of the trenches 13.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a semiconductor substrate having a first major surface;

a trench extending from the first major surface into the semiconductor substrate and having a base and a side wall extending from the base to the first major surface;

a field plate arranged in the trench and having a height f; and a dielectric structure arranged between the semiconductor body and the field plate, wherein the dielectric structure comprises a first portion comprising a first dielectric constant and a second portion comprising a second dielectric constant that is higher than the first dielectric constant, wherein the first portion of the dielectric structure is arranged in a lower portion of the trench and the second portion of the dielectric structure is arranged in an upper portion of the trench, wherein the second portion of the dielectric structure overlaps the height of the field plate by a distance $v_1$, wherein $f*0.1 \le v_1 \le f*0.8$.

2. The semiconductor device of claim 1, wherein the first portion of the dielectric structure is formed of an oxide and the second portion of the dielectric structure is formed of a high K material.

3. The semiconductor device of claim 1, wherein the first portion of the dielectric structure comprises an enclosed cavity that is laterally positioned between a side wall of the field plate and the side wall of the trench and the second portion of the dielectric structure provides a cap that seals the cavity.

4. The semiconductor device of claim 1, wherein the semiconductor device is a transistor device, wherein the semiconductor substrate comprises a drift region of the first conductivity type, a body region of the second conductivity type that opposes the first conductivity type arranged on and forming a pn junction with the drift region, and a source region of the first conductivity type on and/or in the body region, wherein the pn junction is located at a depth d from the first major surface and the second portion vertically overlaps the drift region by a distance $v_2$.

5. The semiconductor device of claim 4, wherein $d*0.1 \le v_2 \le d*0.8$ or $d*0.3 \le v_2 \le d*0.6$.

6. The semiconductor device of claim 4, wherein $f*0.1 \le v_2 \le f*0.8$ or $f*0.3 \le v_2 \le f*0.6$.

7. The semiconductor device of claim 1, wherein the field plate has a lower surface, and wherein the lower surface of the field plate is spaced apart from the base of a trench by a pillar of dielectric material having a height a.

8. The semiconductor device of claim 7, wherein the first portion of the dielectric structure has a base that vertically overlaps with the pillar by a distance b, and wherein $b \ge a*0.6$ or $b \ge a*0.8$.

9. The semiconductor device of claim 1, wherein the field plate and the side wall and the base of the trench are covered with a dielectric layer, and wherein the cavity comprises a base and sidewalls formed by the dielectric layer.

10. The semiconductor device of claim 1, wherein $f*0.3 \le v_1 \le f*0.6$.

11. A method, comprising:

forming a trench in a first major surface of a semiconductor substrate, the trench having a base and a side wall extending from the base to the first major surface;

forming a first insulating layer on the base and the side wall of the trench;

inserting conductive material into the trench and filling the trench;

selectively removing the first insulation layer from the side wall and peripheral regions of the base of the trench to form a recess;

after selectively removing the first insulation layer from the side wall and the peripheral regions of the base of the trench to form the recess, forming a third insulating layer over a surface of a field plate formed from the conductive material in the trench, the side wall of the trench, and the peripheral regions of the base of the trench; and forming a second insulating layer in the trench, wherein the second insulating layer forms a cap that caps the recess to form an enclosed cavity in the trench.

12. The method of claim 11, wherein forming the first insulating layer comprises:

forming a first insulating sublayer on the side wall and the base of the trench;

removing the first insulating sublayer at least from the side wall of the trench such that the first insulating sublayer remains on the base of the trench; and forming a second insulating sublayer on the sidewall of the trench.

13. The method of claim 12, wherein the first insulating layer is further formed over the first major surface of the substrate, wherein the conductive material is further formed over the first insulating layer formed on the first major surface of the substate, the method further comprising:

subsequently carrying out a planarization process.

14. The method of claim 13, wherein the planarization process comprises selectively plasma etching the conductive material, or chemical mechanical polishing the conductive material followed by plasma etching to remove the first insulating layer, or chemical mechanical polishing to remove the conductive material and the first insulating layer.

15. The method of claim 12, wherein:

the first insulating sublayer is formed by high density plasma deposition; and/or the first insulating sublayer is removed from the side wall of the trench by wet etching; and/or the second insulating sublayer is formed by atomic layer deposition; and/or the first insulating layer is removed by wet etching or plasma etching, or wet etching followed by plasma etching; and/or the second insulating layer is formed by atomic layer deposition or chemical vapour deposition or TEOS deposition.

16. The method of claim 12, wherein:

the cap has a thickness x, the field plate has a height f, the cap overlaps the field plate by a distance v1, and $f*0.1 \le v_1 \le f*0.8$ or $f*0.3 \le v_1 \le f*0.6$; and/or a pillar spaces the field plate spaced apart from the base of a trench by a height a, the cavity has a base that vertically overlaps with the pillar by a distance b, and $b \ge a*0.6$ or $b \ge a*0.8$.

17. The method of claim 11, wherein forming the first insulating layer comprises:

forming a first insulating sublayer on the side wall and the base of the trench;

filling the trench with a sacrificial material;

selectively removing the sacrificial material from an upper portion of the trench to form a recess with a plug of sacrificial material at a base of the recess;

removing the first insulating sublayer from the side wall of the trench such that the first insulating sublayer remains on the base of the trench and the plug protrudes above the first insulating sublayer remaining on the base of the trench;

removing the plug; and forming a second insulating sublayer on the sidewall of the trench and on the first insulating sublayer remaining on the base of the trench.

18. The method of claim 11, wherein while the second insulating layer is being formed in the trench to cap the recess and form the enclosed cavity in the trench, the second insulating layer is further formed on the peripheral regions of the base of the trench.

* * * * *